(12) United States Patent
Yeh et al.

(10) Patent No.: US 8,338,906 B2
(45) Date of Patent: Dec. 25, 2012

(54) SCHOTTKY DEVICE

(75) Inventors: Ping-Chun Yeh, Taichung (TW);
Der-Chyang Yeh, Hsinchu (TW);
Ruey-Hsin Liu, Hsinchu (TW); Mingo Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 158 days.

(21) Appl. No.: 12/329,677

(22) Filed: Dec. 8, 2008

(65) Prior Publication Data
US 2009/0283841 A1    Nov. 19, 2009

Related U.S. Application Data

(60) Provisional application No. 61/062,975, filed on Jan. 30, 2008.

(51) Int. Cl.
*H01L 29/66* (2006.01)

(52) U.S. Cl. ............ 257/484; 257/477; 257/E29.338; 257/E21.368; 438/534; 438/570; 438/583

(58) Field of Classification Search .......... 257/384
See application file for complete search history.

(56) References Cited

U.S. PATENT DOCUMENTS

| | | | | |
|---|---|---|---|---|
| 3,906,540 A | * | 9/1975 | Hollins | 257/476 |
| 4,338,622 A | * | 7/1982 | Feth et al. | 257/576 |
| 4,408,387 A | * | 10/1983 | Kiriseko | 438/372 |
| 4,533,933 A | * | 8/1985 | Pellegrini et al. | 257/455 |
| 4,628,339 A | * | 12/1986 | Vora et al. | 257/73 |
| 4,742,377 A | * | 5/1988 | Einthoven | 257/484 |
| 4,816,879 A | * | 3/1989 | Ellwanger | 257/486 |
| 4,862,244 A | * | 8/1989 | Yamagishi | 257/484 |
| 4,864,378 A | * | 9/1989 | Tsaur | 257/451 |
| 4,875,084 A | * | 10/1989 | Tohyama | 257/436 |
| 4,876,586 A | * | 10/1989 | Dyck et al. | 257/451 |
| 4,899,199 A | * | 2/1990 | Gould | 257/484 |
| 5,109,256 A | * | 4/1992 | De Long | 257/476 |
| 5,163,178 A | * | 11/1992 | Gomi et al. | 257/558 |
| 5,163,179 A | * | 11/1992 | Pellegrini | 257/451 |
| 5,166,901 A | * | 11/1992 | Shaw et al. | 365/105 |

(Continued)

FOREIGN PATENT DOCUMENTS

CN      1855551      11/2006

OTHER PUBLICATIONS

"Fully Integrated Passive UHF RFID Transponder IC with 16.7- μW Minimum RF Input Power" Karthaus et al.; IEEE Journal of Solid-State Circuits, vol. 38, No. 10, Oct. 2003.

(Continued)

*Primary Examiner* — N Drew Richards
*Assistant Examiner* — Ankush Singal
(74) *Attorney, Agent, or Firm* — McClure, Qualey & Rodack, LLP

(57) ABSTRACT

An integrated circuit structure has a metal silicide layer formed on an n-type well region, a p-type guard ring formed on the n-type well region and encircling the metal silicide layer. The outer portion of the metal silicide layer extends to overlap the inner edge of the guard ring, and a Schottky barrier is formed at the junction of the internal portion of the metal silicide layer and the well region. A conductive contact is in contact with the internal portion and the outer portion of the metal silicide layer.

9 Claims, 3 Drawing Sheets

U.S. PATENT DOCUMENTS

| | | | | |
|---|---|---|---|---|
| 5,217,911 | A * | 6/1993 | Denda | 438/570 |
| 5,250,834 | A * | 10/1993 | Nowak | 257/350 |
| 5,281,841 | A | 1/1994 | Van Roozendaal et al. | |
| 5,296,388 | A * | 3/1994 | Kameyama et al. | 438/370 |
| 5,298,437 | A * | 3/1994 | McFarlane et al. | 438/328 |
| 5,320,971 | A * | 6/1994 | Eklund et al. | 438/328 |
| 5,418,185 | A | 5/1995 | Todd et al. | |
| 5,436,496 | A * | 7/1995 | Jerome et al. | 257/529 |
| 5,478,764 | A * | 12/1995 | Inoue | 438/530 |
| 5,539,237 | A | 7/1996 | Todd et al. | |
| 5,814,873 | A * | 9/1998 | Konuma | 257/449 |
| 5,859,465 | A * | 1/1999 | Spring et al. | 257/484 |
| 6,121,122 | A * | 9/2000 | Dunn et al. | 438/583 |
| 6,150,225 | A * | 11/2000 | Takahashi | 438/357 |
| 6,191,015 | B1 * | 2/2001 | Losehand et al. | 438/570 |
| 6,211,560 | B1 * | 4/2001 | Jimenez et al. | 257/451 |
| 6,261,932 | B1 * | 7/2001 | Hulfachor | 438/570 |
| 6,551,911 | B1 * | 4/2003 | Losehand et al. | 438/581 |
| 6,597,050 | B1 * | 7/2003 | Dunn et al. | 257/453 |
| 6,633,071 | B1 * | 10/2003 | Furio | 257/383 |
| 6,683,362 | B1 * | 1/2004 | O et al. | 257/471 |
| 6,703,280 | B2 * | 3/2004 | Kim et al. | 438/301 |
| 6,815,303 | B2 * | 11/2004 | Ahn et al. | 438/343 |
| 6,852,578 | B2 * | 2/2005 | Chang | 438/167 |
| 6,936,905 | B2 * | 8/2005 | Wu | 257/484 |
| 6,960,811 | B2 * | 11/2005 | Wu et al. | 257/361 |
| 7,064,407 | B1 * | 6/2006 | Mallikarjunaswamy | 257/471 |
| 7,098,521 | B2 * | 8/2006 | Coolbaugh et al. | 257/484 |
| 7,268,413 | B2 * | 9/2007 | Ahn et al. | 257/584 |
| 7,518,215 | B2 * | 4/2009 | Coolbaugh et al. | 257/595 |
| 7,662,698 | B2 * | 2/2010 | Tabatabaie | 438/454 |
| 7,705,409 | B2 * | 4/2010 | Kwon et al. | 257/402 |
| 2001/0017393 | A1 * | 8/2001 | Fujihira et al. | 257/475 |
| 2002/0190338 | A1 * | 12/2002 | Skocki | 257/471 |
| 2003/0030120 | A1 * | 2/2003 | Fujihira et al. | 257/471 |
| 2003/0047786 | A1 * | 3/2003 | Lee et al. | 257/355 |
| 2004/0089908 | A1 * | 5/2004 | Desko et al. | 257/471 |
| 2005/0082618 | A1 * | 4/2005 | Wu et al. | 257/355 |
| 2005/0110108 | A1 * | 5/2005 | Patel et al. | 257/453 |
| 2006/0071292 | A1 * | 4/2006 | Coolbaugh et al. | 257/480 |
| 2006/0091493 | A1 * | 5/2006 | Wu | 257/484 |
| 2006/0113624 | A1 * | 6/2006 | Wu | 257/471 |
| 2006/0131619 | A1 * | 6/2006 | Wu | 257/260 |
| 2006/0131686 | A1 * | 6/2006 | Wu | 257/484 |
| 2006/0138450 | A1 * | 6/2006 | Lanois et al. | 257/109 |
| 2006/0145300 | A1 * | 7/2006 | Coolbaugh et al. | 257/595 |
| 2006/0163623 | A1 * | 7/2006 | Noda et al. | 257/288 |
| 2006/0180892 | A1 * | 8/2006 | Pardoen | 257/484 |
| 2006/0208332 | A1 * | 9/2006 | Duskin et al. | 257/484 |
| 2006/0237813 | A1 * | 10/2006 | Hshieh et al. | 257/475 |
| 2006/0244050 | A1 * | 11/2006 | Sudou | 257/324 |
| 2006/0246680 | A1 * | 11/2006 | Bhattacharyya | 438/400 |
| 2006/0281291 | A1 * | 12/2006 | Dietz et al. | 438/597 |
| 2007/0069306 | A1 * | 3/2007 | Kapoor et al. | 257/369 |
| 2007/0075362 | A1 * | 4/2007 | Wu | 257/335 |
| 2008/0006899 | A1 * | 1/2008 | Kim et al. | 257/476 |
| 2008/0135970 | A1 * | 6/2008 | Kim et al. | 257/471 |
| 2009/0218656 | A1 * | 9/2009 | Gonzalez et al. | 257/529 |
| 2009/0236679 | A1 * | 9/2009 | Chiang et al. | 257/483 |
| 2009/0294865 | A1 * | 12/2009 | Tang et al. | 257/369 |

OTHER PUBLICATIONS

Chinese language office action dated Feb. 22, 2012.
English language translation of abstract of CN 1855551 (published Nov. 1, 2006).

* cited by examiner

SCHOTTKY DEVICE

This application claims the benefit of U.S. Provisional Patent Application Ser. No. 61/062,975, filed Jan. 30, 2008, which application is hereby incorporated herein by reference.

TECHNICAL FIELD

The present invention relates to integrated circuits, and particularly to a semiconductor device having a Schottky barrier diode.

BACKGROUND

Schottky barrier diode, which has advantages of fast switching speed and low forward voltage drop, has been used widely for lower power rectifier or detector circuits in high-frequency range. Integrated silicon-based Schottky barrier diode into CMOS RF IC can increase high frequency performance and decrease the production cost and chip size, in particular for fabricating dc voltage generator in a passive RFID chip. Typically, Schottky diode consists of a metal layer connected to a doped semiconductor layer, and the Schottky barrier is formed at the juncture of the metal layer and the semiconductor layer. Breakdown voltage is improved by placing a p-type guard ring in a semiconductor substrate around the Schottky barrier. Traditionally the p-type guard ring is separated from the Schottky barrier by an optimized distance, or in contact with a portion of the Schottky barrier. However, conventional Schottky barrier diodes exhibit higher than desirable leakage current at the reverse bias, causing higher power dissipation and limiting the circuit applications in RFID, charge pump, etc.

SUMMARY OF THE INVENTION

In accordance with one aspect of the present invention, an integrated circuit structure includes a semiconductor substrate, a well region of a first conductive type formed in the semiconductor substrate, a metal silicide layer formed on the first well region and having an internal portion and an outer portion, and a guard ring of a second conductive type opposite the first conductivity type formed on the well region and encircling the metal silicide layer. The outer portion of the metal silicide layer extends to overlap the inner edge of the guard ring, and a Schottky barrier is formed at the junction of the internal portion of the metal silicide layer and the well region. A conductive contact is in contact with the internal portion and the outer portion of the metal silicide layer.

In accordance with another aspect of the present invention, an integrated circuit structure includes a semiconductor substrate having a first area and two second areas separated from each other by isolation regions, a well region of a first conductive type formed in the semiconductor substrate, a metal silicide layer formed on the first well region within the first area and having an internal portion and an outer portion, and a guard ring of a second conductive type opposite the first conductivity type formed on the well region within the first area and encircling the metal silicide layer. A Schottky barrier is formed at the junction of the internal portion of the metal silicide layer and the well region. The outer portion of the metal silicide layer extends to overlap the inner edge of the guard ring. Two diffusion regions of the first conductive type are formed in the well region within the two second areas respectively. A conductive contact structure has a first conductive contact in contact with the internal portion and the outer portion of the metal silicide layer and two second conductive contacts in contact with the two diffusion regions respectively.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

Figure 1:
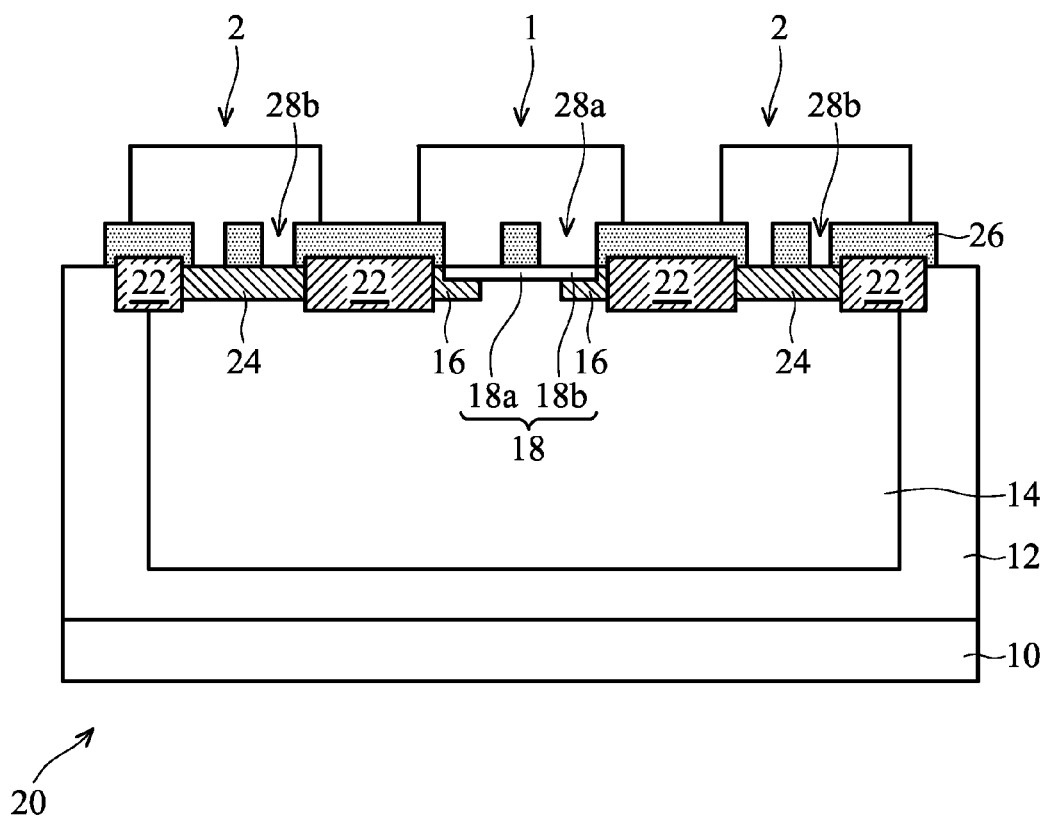
FIG. 1 is a cross-sectional diagram illustrating an exemplary embodiment of a Schottky barrier diode.

Embodiments of the present disclosure provide a semiconductor device having a Schottky barrier diode with a conductive contact structure for reducing the contact resistance and decreasing leakage current.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIG. 1, a cross-sectional view of an embodiment of Schottky barrier diode according to the present invention is shown. A substrate 10 includes a first area 1 (anode area) for forming an anode electrode of Schottky barrier diode 20, and two second areas 2 (cathode areas) for forming two cathode electrodes of Schottky barrier diode 20. The first area 1 and second areas 2 are defined and isolated from each other by isolation regions 22.

Figure 2:
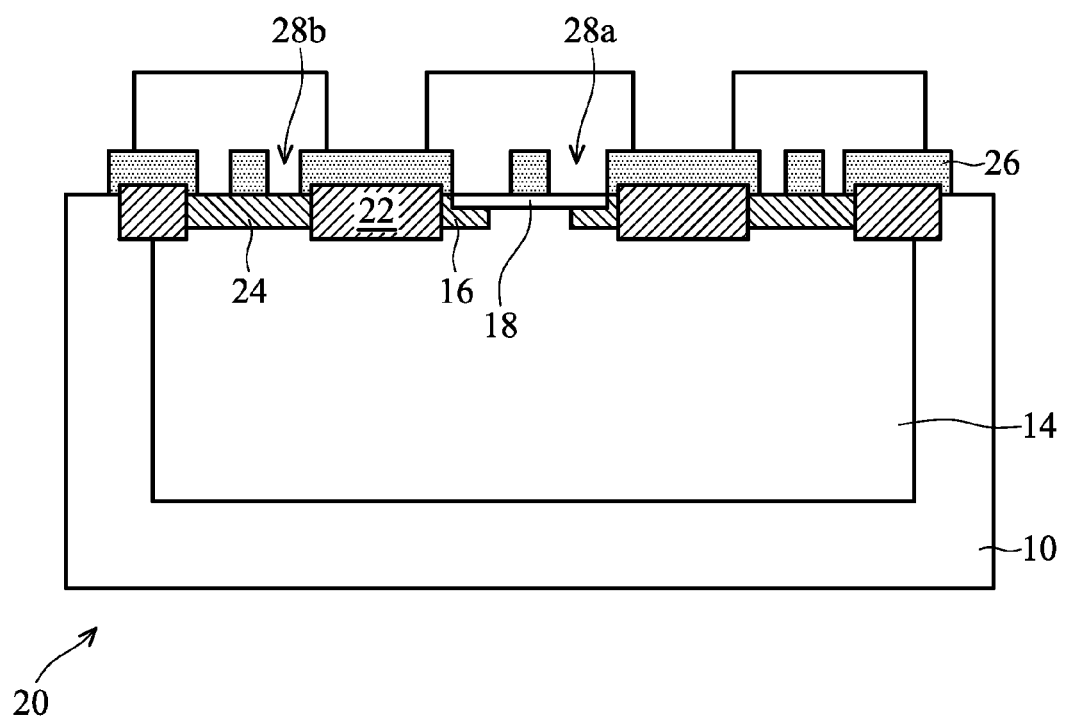
FIG. 2 is a cross-sectional diagram illustrating another exemplary embodiment of a Schottky barrier diode.

The substrate 10 is a semiconductor substrate formed of a semiconductor material, for example, silicon or other group III, group IV, and/or group V elements. The substrate 10 comprises a Deep N-type well (DNW) region 12 and an N-type well (NW) region 14 formed in the DNW region 12. The DNW region 12 may be optional in an embodiment as shown in FIG. 2, where the DNW region 12 is omitted. The NW region 14 is often referred to as high-voltage n-well (HVNW) region for its relatively low impurity concentration. As is known in the art, the n-type well region may be formed by implanting the substrate with an n-type impurity, such as phosphorous and/or arsenic. Alternatively, the n-type well region may be formed by epitaxially growing a semiconductor layer on the substrate, and then performing an n-type impurity implantation. In an exemplary embodiment, the n-type well region has an impurity concentration of between about $1E15/cm^3$ and about $1E18/cm^3$, although higher or lower impurity concentrations are also applicable.

A metal silicide layer 18 is formed on the NW region 14 within the first area 1 to function as an anode electrode of Schottky barrier diode 20. Partially due to a relatively low impurity concentration in the NW region 14, Schottky barrier is formed at the junction of the metal silicide layer 18 and the NW region 14. In an embodiment, the metal silicide layer 18 is cobalt silicide, although other metal silicides, such as titanium silicide, tantalum silicide, tungsten silicide, platinum silicide and combinations thereof, can be used. Alternatively, the metal silicide layer may be replaced by other materials suitable for forming Schottky barriers, such as pure metals, metal compounds, and the like. A metal material having a work function depending on the size of a Schottky barrier to be formed can be selected. For example, tungsten (W), titanium (Ti), chromium (Cr), silver (Ag), palladium (Pd), or the like can be used. The metal silicide layer 18 may be formed using a self-aligned silicidation process, which includes selectively forming a metal layer (not shown) on the NW region 14, and performing an annealing to react the metal with the underlying silicon. Preferably, the metal layer is fully consumed during the silicidation process, although a layer of metal may be left un-reacted after the annealing.

P-type region(s) 16 forms a ring (please refer to the top view shown in FIG. 3) in the NW region 14 within the first area 1. The p-type region 16 is also referred to as a p-type ring 16 throughout the description. The p-type ring 16 is adjacent the Schottky barrier, encircling the metal silicide layer 18. The inner edge of the p-type ring 16 contacts the outer portion 18b of the metal silicide layer 18, and has portions extending under and overlapping the outer portion 18b of the metal silicide layer 18. Therefore, the metal silicide layer 18 has an internal portion 18a over the Schottky barrier, and an outer portion 18b over the p-type ring 16. The outer edge of the p-type ring 16 physically contacts the STI regions 22. The p-type ring 16 has an impurity concentration in an exemplary range of between about $1E16/cm^3$ and about $1E18/cm^3$.

The isolation regions 22 are formed in the NW region 14 to surround the p-type ring 16. In an embodiment, the isolation region 22 is a shallow trench isolation (STI) region, and hence is referred to as STI region 22 throughout the description. Alternatively, the isolation region 22 may be a field oxide region formed, for example, by well-known local oxidation of silicon (LOCOS).

Two heavily doped n-type ($N^+$) diffusion region(s) 24 are formed at the surface of the NW region 14 within the areas 2 and separated from the p-type ring 16 by the isolation region(s) 22. The two $N^+$ diffusion regions 24 function as two cathode electrodes of the Schottky barrier diode 20. In the described embodiments, heavily doped means an impurity concentration of greater about $10^{20}/cm^3$. One skilled in the art will recognize, however, that heavily doped is a term of art that depends upon the specific device type, technology generation, minimum feature size, and the like. It is intended, therefore, that the term be interpreted in light of the technology being evaluated and not be limited to the described embodiments.

A conductive contact structure includes a plurality of metal contacts 28a and 28b formed in an interlayer-dielectric (ILD) layer 26 on the resulting substrate 10. The metal contact 28a is contacted to the first portion 18a of the silicide layer 18 over the Schottky barrier and the second portion 18b of the silicide layer 18 over the inner edge of the p-type ring 16. The metal contact 28b is contacted to the $N^+$ diffusion region 24. Examples of metal contacts include but are not limited to: titanium, tungsten, tantalum, aluminum, or copper. The metal contacts 28a and 28b will couple to metal layers for connection to other components as known in the art.

Figure 3:
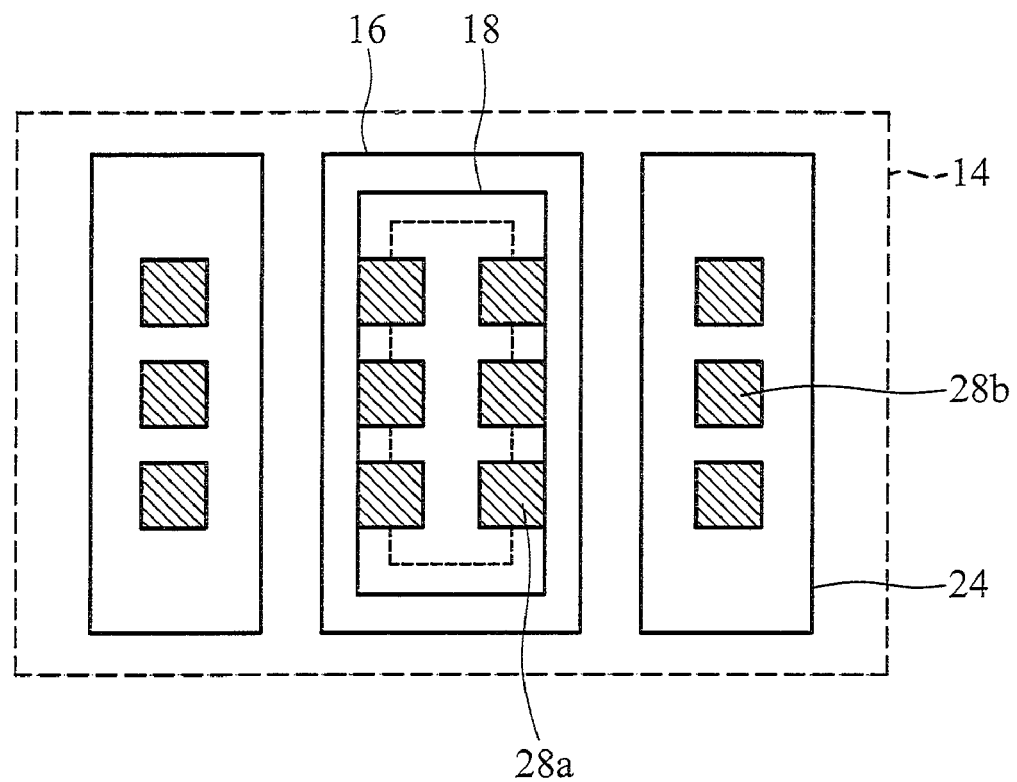
FIG. 3 is a top-view diagram illustrating an exemplary embodiment of a conductive contact structure of a Schottky barrier diode.

FIG. 3 schematically illustrates a top view of the structure shown in FIG. 1 or 2. It shows the p-type ring 16 forming a ring encircling the metal silicide layer 18, wherein each of the metal contacts 28a contacts the first portion 18a and the second portion 18b of the metal silicide layer 18, thus each the metal contact 28a couples to a part of the Schottky barrier and a part of the p-type ring 16 simultaneously.

The structures shown in FIGS. 1 and 2 may be formed using various methods. The corresponding process steps are discussed briefly as follows. In an exemplary embodiment, a p-type substrate 20 is provided, and then the DNW region 12 and the NW region 14 are formed in the p-type substrate 20 by implantations. Next, the STI regions 22 are formed, for example, by etching the NW region 14 to form recesses, and filling the recesses with dielectric material such as oxides. The $N^+$ region 24 and p-type ring 16 are also formed in the NW region 14 using implantations. The metal silicide layer 18 may be formed by a self-aligned silicidation process on the top surface of the NW region 14 in the anode area 1, extending to overlap the inner portion of the p-type ring 16.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. An integrated circuit structure, comprising:
    a semiconductor substrate having a first area and two second areas separated from each other by shallow trench isolation (STI) regions;
    a well region of a first conductive type formed in the semiconductor substrate;
    a metal silicide layer formed on the well region within the first area and having an internal portion and an outer portion, wherein a Schottky barrier is formed at the junction of the internal portion of the metal silicide layer and the well region;
    a guard ring of a second conductive type opposite the first conductivity type formed on the well region within the first area and encircling the metal silicide layer, wherein the outer portion of the metal silicide layer extends to overlap the inner edge of the guard ring and the outer edge of the guard ring physically contacts the shallow trench isolation (STI) regions;
    two diffusion regions of the first conductive type formed in the well region within the two second areas respectively;
    an inter-dielectric layer formed on the shallow trench isolation region; and
    a conductive contact structure formed in the inter-dielectric layer and comprising a first conductive contact in physical contact with the internal portion and the outer portion of the metal silicide layer and two second conductive contacts in contact with the two diffusion regions respectively, wherein the conductive contact structure is isolated to the two diffusion regions via the inter-dielectric layer.

2. The integrated circuit structure of claim 1, wherein the first conductive contact is formed over the Schottky barrier and the inner edge of the guard ring.

3. The integrated circuit structure of claim 1, wherein the metal silicide layer comprises cobalt.

4. The integrated circuit structure of claim 1, wherein the well region is an n-type well region, and the guard ring is a p-type ring.

5. The integrated circuit structure of claim 1, further comprising a deep well region formed in the semiconductor substrate, wherein the well region is formed within the deep well region.

6. The integrated circuit structure of claim 1, wherein the metal silicide layer functions as an anode electrode of a Schottky Barrier diode, and the two diffusion regions function as two cathode electrodes of the Schottky Barrier diode.

7. The integrated circuit structure of claim 1, wherein the semiconductor substrate is a p-type silicon substrate.

8. The integrated circuit structure of claim 4, wherein the diffusion region is an n-type diffusion region having a higher impurity concentration than the n-type well region.

9. The integrated circuit structure of claim 5, wherein the deep well region is an n-type deep well region having a higher impurity concentration than the well region.

* * * * *